(12) United States Patent
Swift et al.

(10) Patent No.: US 9,728,410 B2
(45) Date of Patent: Aug. 8, 2017

(54) SPLIT-GATE NON-VOLATILE MEMORY (NVM) CELL AND METHOD THEREFOR

(71) Applicant: FREESCALE SEMICONDUCTOR, INC., Austin, TX (US)

(72) Inventors: Craig T. Swift, Austin, TX (US); Asanga H. Perera, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 14/508,629

(22) Filed: Oct. 7, 2014

(65) Prior Publication Data

US 2016/0099153 A1    Apr. 7, 2016

(51) Int. Cl.
| | |
|---|---|
| *H01L 21/28* | (2006.01) |
| *H01L 29/423* | (2006.01) |
| *H01L 29/66* | (2006.01) |
| *H01L 29/792* | (2006.01) |
| *H01L 29/788* | (2006.01) |

(52) U.S. Cl.
CPC .. *H01L 21/28273* (2013.01); *H01L 29/42328* (2013.01); *H01L 29/66825* (2013.01); *H01L 29/7881* (2013.01)

(58) Field of Classification Search
CPC ................ H01L 21/28282; H01L 21/28273
See application file for complete search history.

(56) References Cited

U.S. PATENT DOCUMENTS

| | | | |
|---|---|---|---|
| 5,923,976 A | 7/1999 | Kim | |
| 6,255,166 B1* | 7/2001 | Ogura | H01L 21/28202 257/E21.21 |
| 7,737,031 B2 | 6/2010 | Alapati et al. | |
| 7,923,328 B2 | 4/2011 | White et al. | |
| 2006/0019436 A1* | 1/2006 | Lee | H01L 21/28273 438/197 |
| 2007/0218633 A1* | 9/2007 | Prinz | B82Y 10/00 438/267 |
| 2009/0215243 A1* | 8/2009 | Ogura | H01L 21/76224 438/435 |
| 2009/0256191 A1* | 10/2009 | White | B82Y 10/00 257/319 |
| 2012/0068243 A1* | 3/2012 | Kawashima | H01L 27/11573 257/315 |
| 2013/0240977 A1* | 9/2013 | Kaneoka | H01L 29/66833 257/325 |

* cited by examiner

*Primary Examiner* — Su C Kim
*Assistant Examiner* — David S Wilbert

(57) ABSTRACT

A split gate memory device includes a semiconductor substrate and a select gate over the substrate. The select gate has a bottom portion and a top portion over the bottom portion, wherein the top portion has a top sidewall and the bottom portion has a bottom sidewall, and wherein the bottom sidewall extends beyond the top sidewall. The devices also includes a control gate adjacent the select gate, a charge storage layer located between the select gate and the control gate and between the control gate and the substrate, and an isolation region over the bottom portion of the select gate and between the top sidewall of the select gate and the charge storage layer. The bottom sidewall of the bottom portion extends to the charge storage layer.

14 Claims, 21 Drawing Sheets

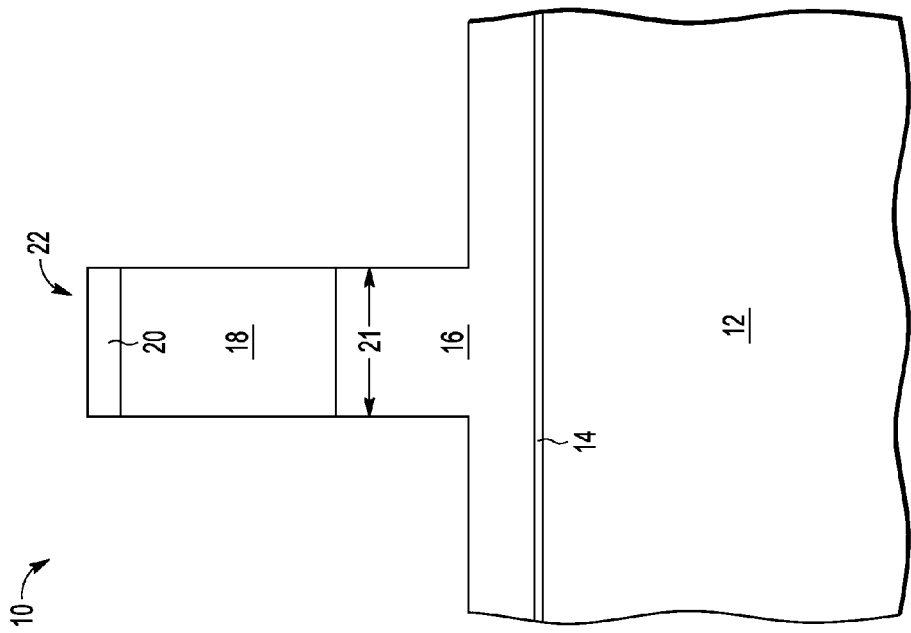
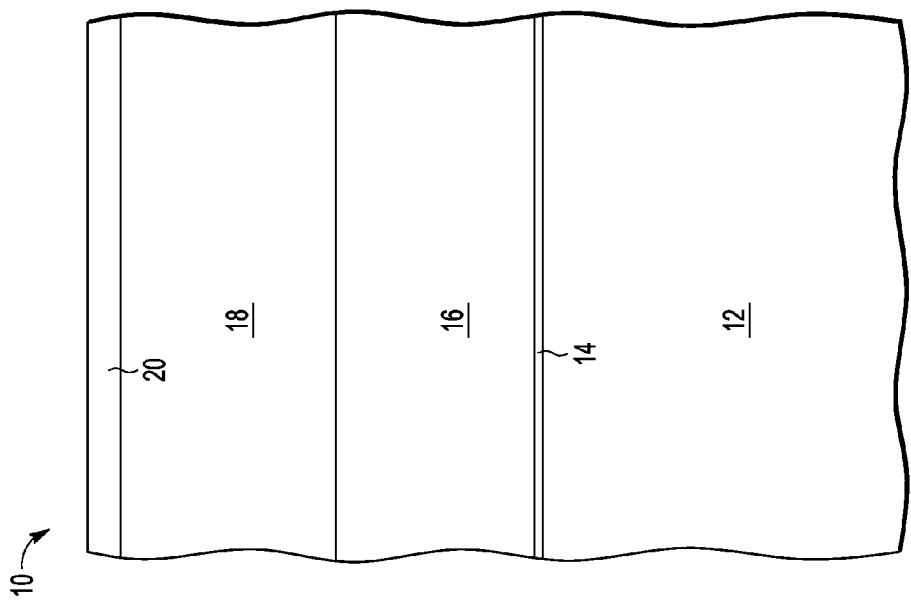

SPLIT-GATE NON-VOLATILE MEMORY (NVM) CELL AND METHOD THEREFOR

BACKGROUND

Field

This disclosure relates generally to semiconductor manufacturing, and more specifically, to split-gate NVM cells.

Related Art

In manufacturing non-volatile memories (NVMs), as well as semiconductor manufacturing in general, there is a continuing push to reduce the size of the various semiconductor devices on a given integrated circuit. One way this is achieved is with improving the ability to manufacture semiconductor devices with smaller dimensions such as gate length. This is typically achieved with a combination of lithography improvements and process improvements. There is similarly a continuing push to use higher performance structures such as high k dielectrics for gate dielectrics and metal for gates. The higher performance structures raise issues such as at what point in a particular process can a particular higher performance structure be introduced. The interplay between structures and the process, including the timing of the process, can become complicated.

Accordingly there is a need to provide further improvement in achieving a split-gate NVM cell that can be made using somewhat different processes from those historically used so as to be more robust as to the environments that may be involved in the required processing.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 1 is a cross section of a split-gate non-volatile memory (NVM) cell at a stage in processing according to a first process;

FIG. 2 is a cross section of the split-gate NVM cell FIG. 1 at a subsequent stage in processing;

DETAILED DESCRIPTION

Figure 3:
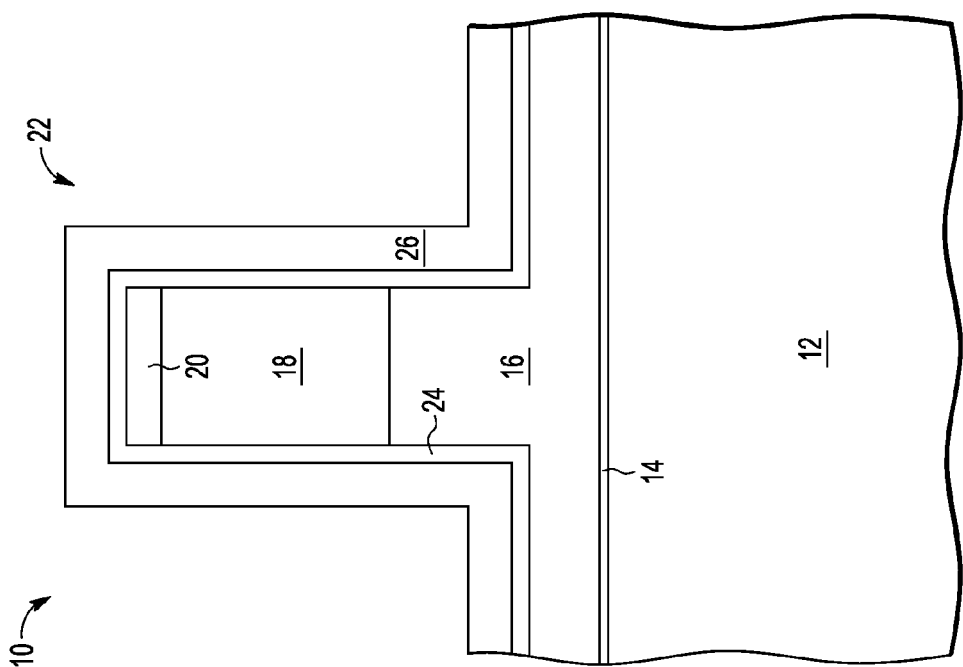
FIG. 3 is a cross section of the split-gate NVM cell of FIG. 2 at a subsequent stage in processing.

In one aspect, a split gate NVM cell is made such that the select gate is made with a narrower upper portion than the lower portion with the result that the upper portion is spaced further from the control gate than is the lower portion. The upper portion of the space between select gate and the control gate is more likely to have contamination and is also more likely to have an opportunity for siliciding to bridge across a charge storage layer which separates the select gate from the control gate, especially if a polysilicon nanocrystal is exposed to the siliciding. This is better understood by reference to the drawings and the following written description.

The semiconductor substrate described herein can be any semiconductor material or combinations of materials, such as gallium arsenide, silicon germanium, silicon-on-insulator (SOI), silicon, monocrystalline silicon, the like, and combinations of the above.

Shown in FIG. 1 is a semiconductor device 10 having a substrate 12, a gate dielectric layer 14 that may be a grown oxide for the case substrate 12 having a top surface that is silicon, a conductive layer 16 over gate dielectric layer 14 that is useful as a select gate and may be polysilicon, a dielectric layer 18 that may be nitride and a thickness about the same as that of conductive layer 16, and a dielectric layer 20 that is thinner than dielectric layer 18 and may be deposited oxide.

Shown in FIG. 2 is semiconductor device 10 after performing a patterned etch of dielectric layer 20, dielectric layer 18, and an upper portion of conductive layer 16 to form a select gate stack 22 in which the upper portion of conductive layer 16 has a width 21.

Shown in FIG. 3 is semiconductor device 10 after forming a dielectric layer 24 over select gate stack 22 that may be oxide and a dielectric layer 26 that may be nitride over dielectric layer 26. Dielectric layer 24 is useful as a liner and is thinner than dielectric layer 26.

Figure 4:
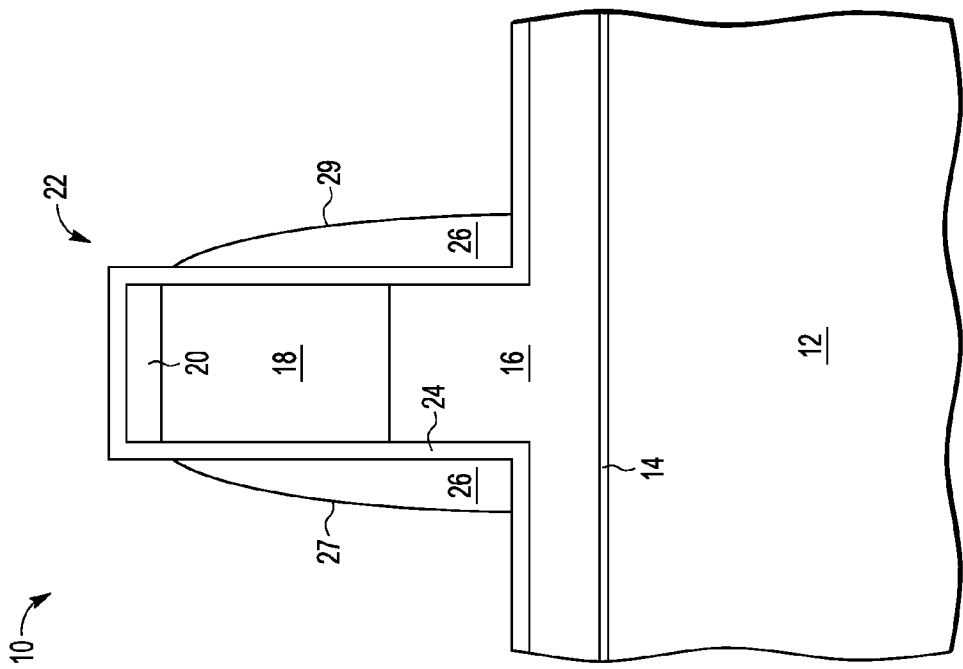
FIG. 4 is a cross section of the split-gate NVM cell of FIG. 3 at a subsequent stage in processing.

Shown in FIG. 4 is semiconductor device 10 after performing an anisotropic etch of dielectric layer 26 to result in remaining dielectric layer 26 being a sidewall spacer 27 along one side and a sidewall spacer 29 along an opposing side of select gate stack 22.

Figure 5:
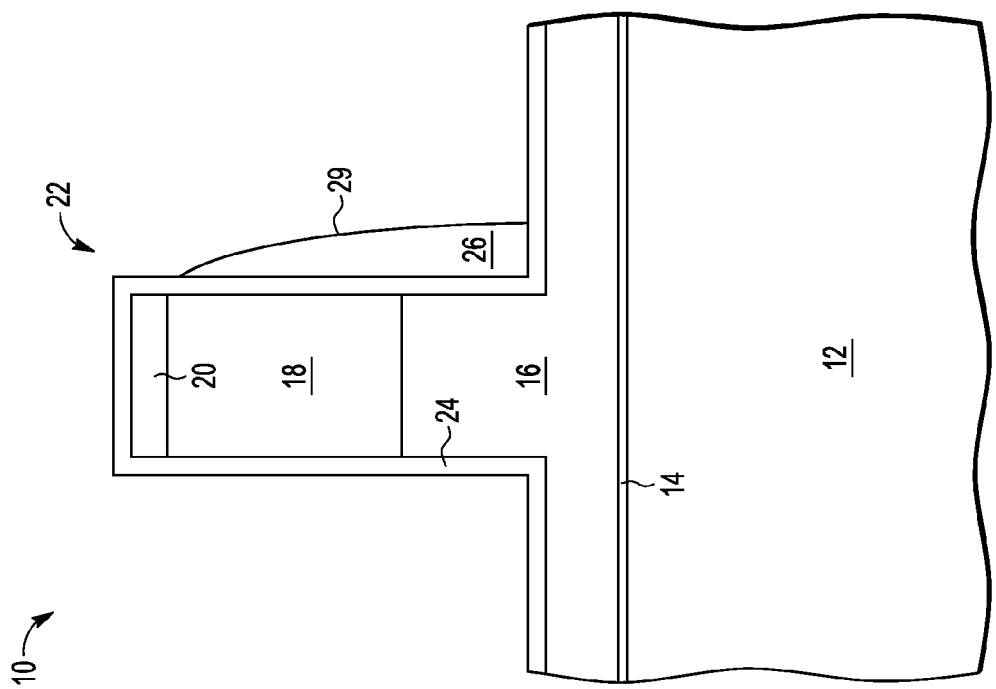
FIG. 5 is a cross section of the split-gate NVM cell of FIG. 4 at a subsequent stage in processing.

Shown in FIG. 5 is semiconductor device 10 after performing a patterned etch that removes sidewall spacer 27.

Figure 6:
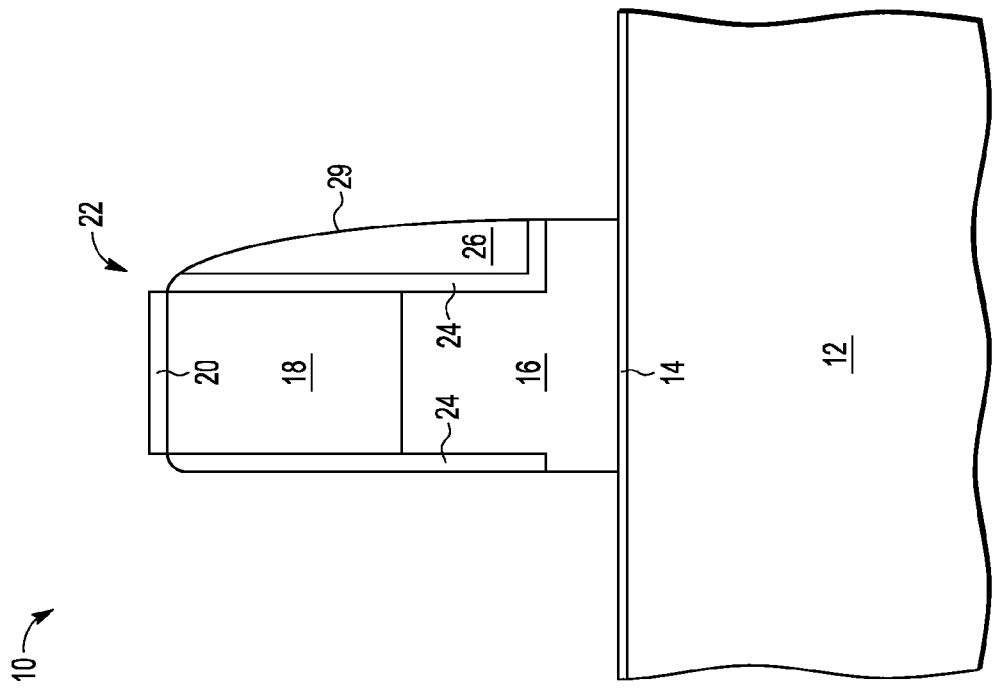
FIG. 6 is a cross section of the split-gate NVM cell of FIG. 5 at a subsequent stage in processing.

Shown in FIG. 6 is semiconductor device 10 after a blanket etch that removes dielectric layer 24 from the top of select gate stack 22, over the lower portion of select gate stack 22 where sidewall spacer 27 was present, and over the lower portion of select gate stack 22 adjacent to sidewall spacer 29 and reduces the thickness of dielectric layer 20 on the top of select gate stack 22. The etch continues by switching to an etchant that etches conductive layer 16 that removes the lower portion of select gate stack 22 on the side where sidewall spacer 27 was present and the lower portion of select gate stack 22 adjacent to sidewall spacer 27. The result is that the lower portion of select gate stack 22, which is the remaining portion of conductive layer 16 and that will be the select gate, has a remaining portion extending under sidewall spacer 29. This can be viewed as the select gate, the remaining portion of conductive layer 16, having a top portion having a top sidewall and a bottom portion having a bottom sidewall in which the bottom sidewall extends beyond the top sidewall.

Figure 7:
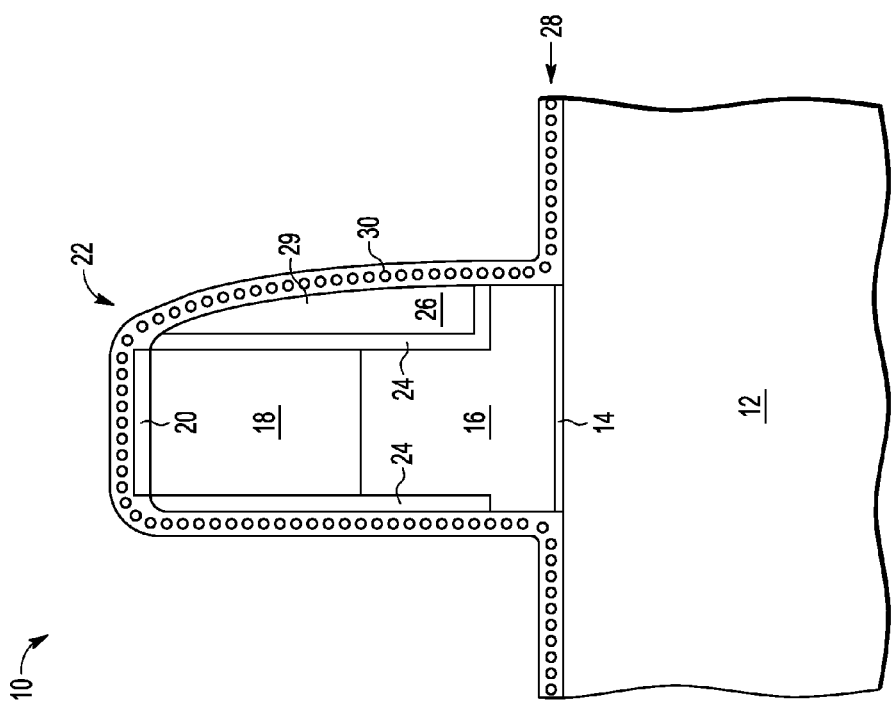
FIG. 7 is a cross section of the split-gate NVM cell of FIG. 6 at a subsequent stage in processing.

Shown in FIG. 7 is semiconductor device 10 after forming a blanket charge storage layer 28 over select gate stack 22 of FIG. 6. Charge storage layer 28 may include nanocrystals in which nanocrystal 30 is one. Charge storage layer 28 may be formed by removing dielectric layer 14 where it is exposed, forming a bottom dielectric layer, forming nanocrystals, and forming a top dielectric layer that surrounds and is over the nanocrystals.

Figure 8:
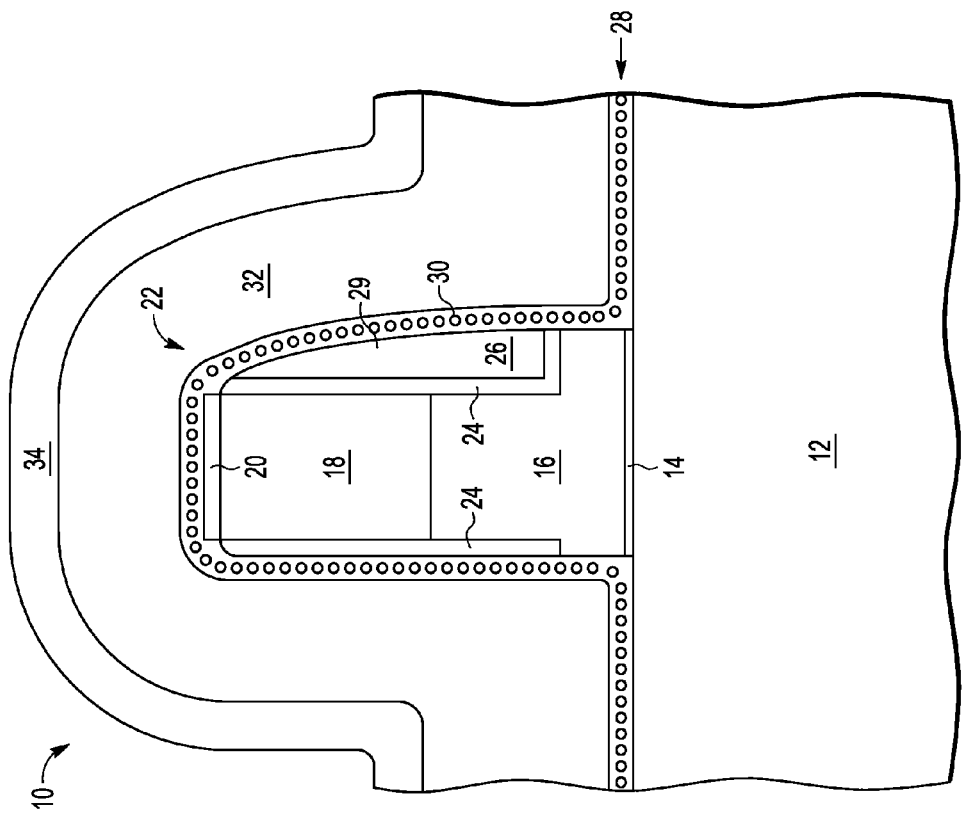
FIG. 8 is a cross section of the split-gate NVM cell of FIG. 7 at a subsequent stage in processing.

Shown in FIG. 8 is semiconductor device 10 after forming a conductive layer 32 that may be polysilicon over select gate stack 22 and a dielectric layer 34 that may be nitride over conductive layer 32.

Figure 9:
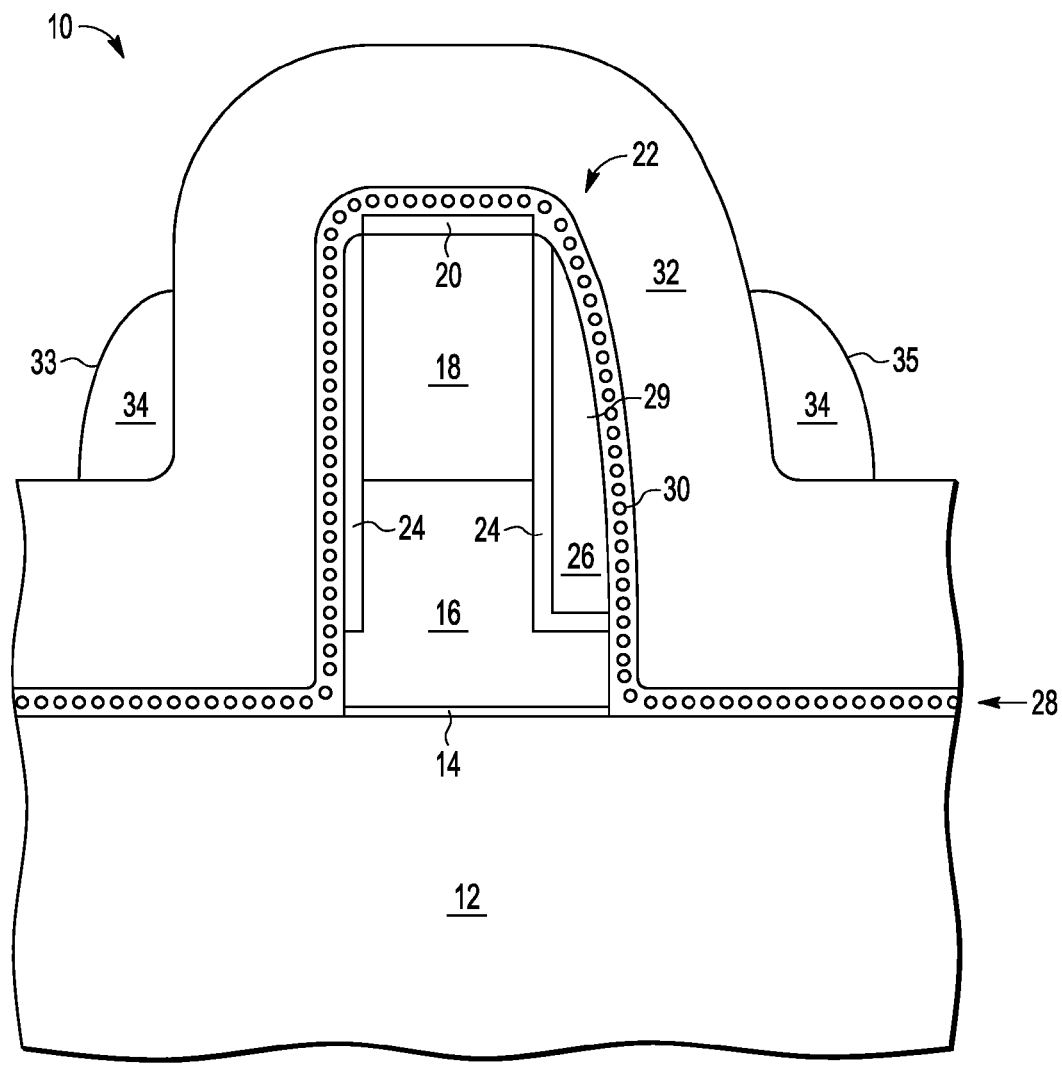
FIG. 9 is a cross section of the split-gate NVM cell of FIG. 8 at a subsequent stage in processing.

Shown in FIG. 9 is semiconductor device 10 after performing an anisotropic etch of dielectric layer 34 to leave a sidewall spacer 33 on the side of select gate stack where sidewall spacer 27 was removed and a sidewall spacer 35 on the side where sidewall spacer 29 is present.

Figure 10:
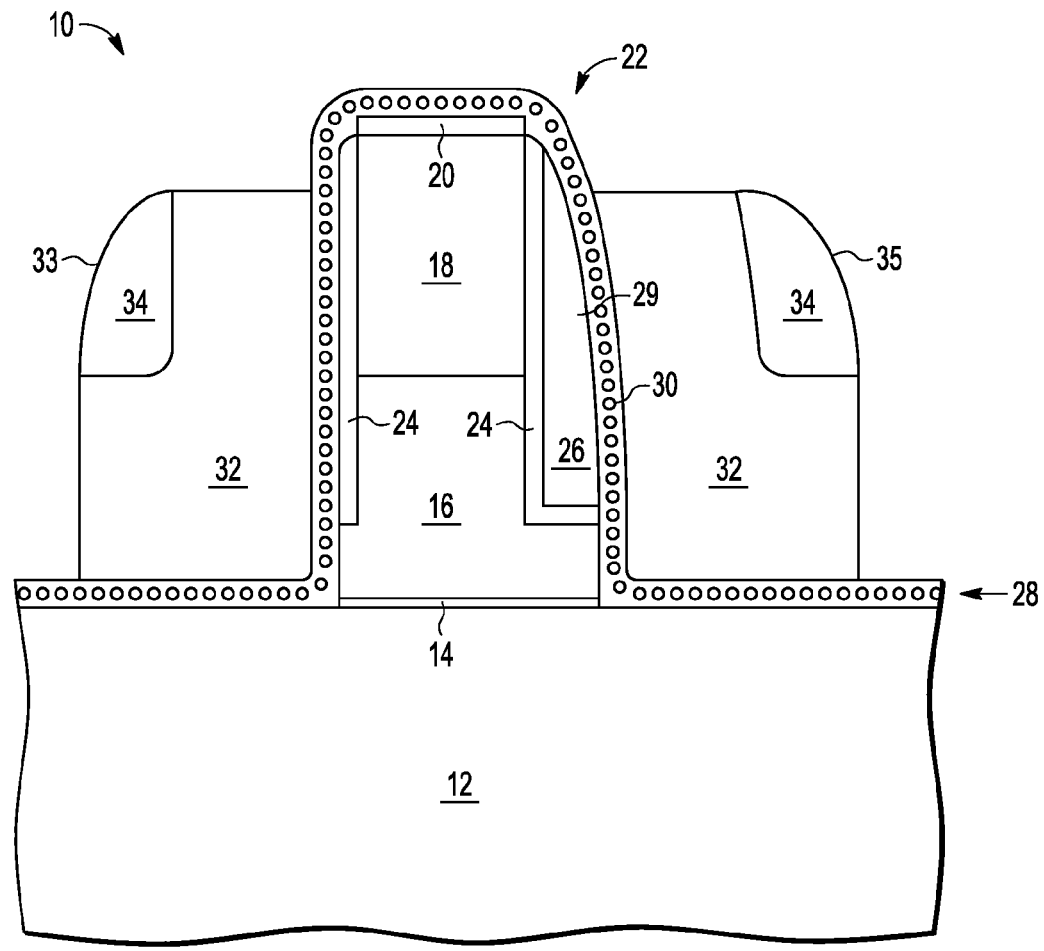
FIG. 10 is a cross section of the split-gate NVM cell of FIG. 9 at a subsequent stage in processing.

Shown in FIG. 10 is semiconductor device 10 after a blanket etch is performed which etches conductive layer 32. Sidewall spacers 33 and 35 function as etch masks during this etch and thereby determine the distance conductive layer 32 extends from select gate stack 22.

Figure 11:
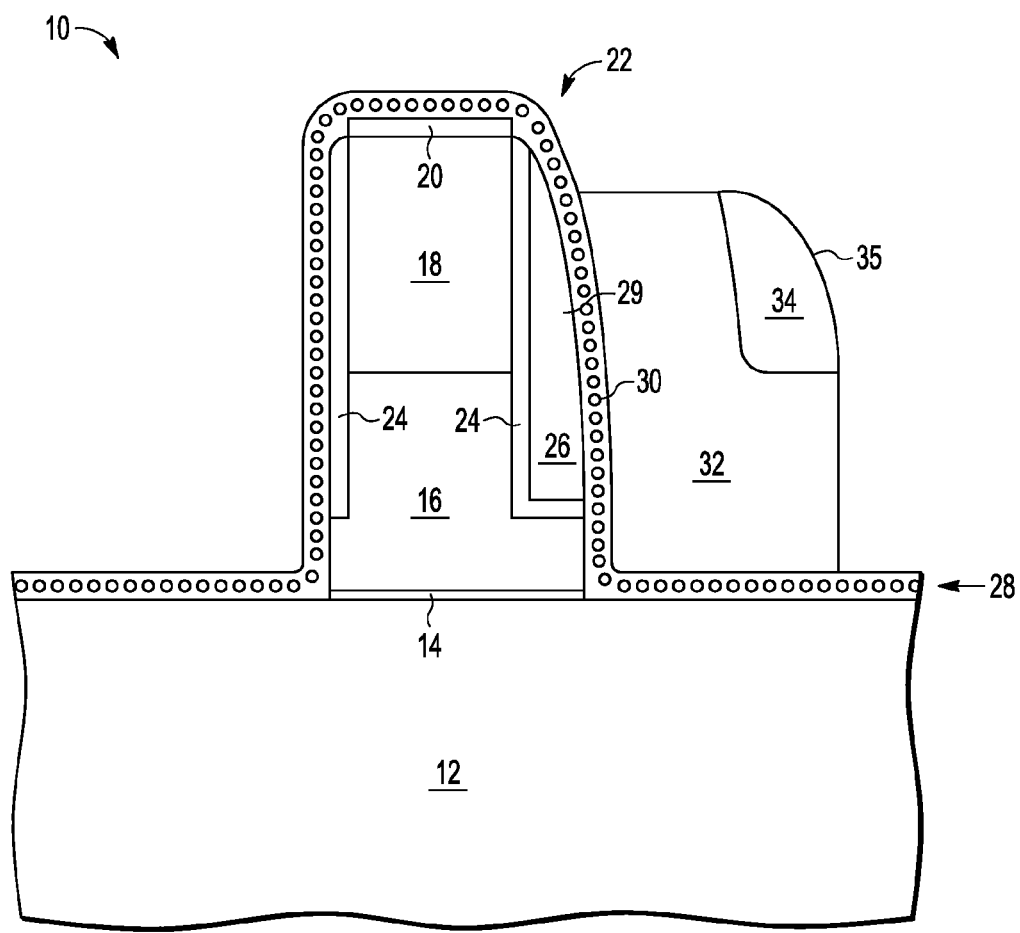
FIG. 11 is a cross section of the split-gate NVM cell of FIG. 10 at a subsequent stage in processing.

Shown in FIG. 11 is semiconductor device 10 after performing a patterned etch that first removes sidewall spacer 33 and then, with a change in etchant, conductive layer 32 on the side of select gate stack 22 that had sidewall spacer 33.

Figure 12:
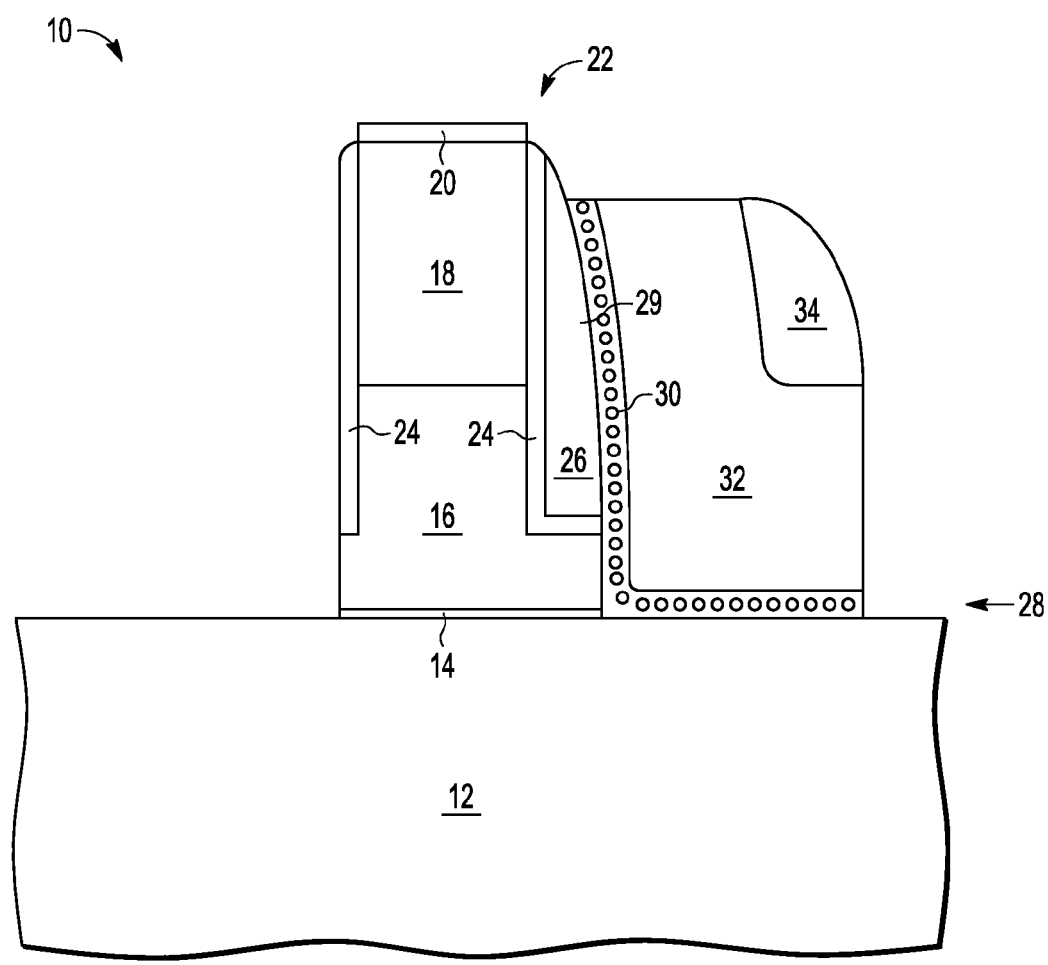
FIG. 12 is a cross section of the split-gate NVM cell of FIG. 11 at subsequent stage in processing.

Shown in FIG. 12 is semiconductor device 10 after a blanket etch that may include a change in etchants that removes charge storage layer 28 where it is exposed. The result is that charge storage layer 28 remains between substrate 12 and conductive layer 32 and between select gate stack 22 and conductive layer 32. The upper portion of select gate stack 22 is spaced from conductive layer 32 and charge storage layer by sidewall spacer 29 and dielectric layer 24.

Figure 13:
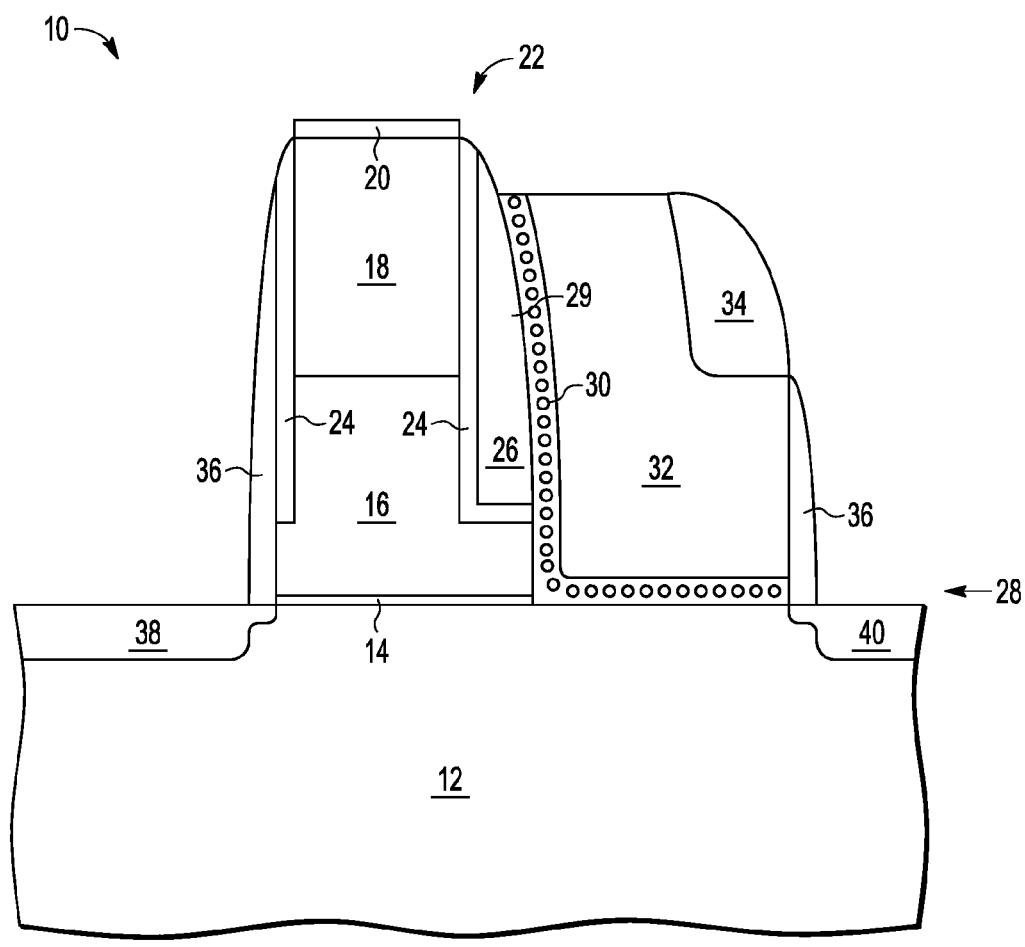
FIG. 13 is a cross section of the split-gate NVM cell of FIG. 12 at a subsequent stage in processing.

Shown in FIG. 13 is semiconductor device 10 after forming a sidewall spacer around select gate stack 22 and conductive layer 32, forming source/drain regions 38 and 40 using sidewall spacer 36, conductive layer 16, and conductive layer 32.

Figure 14:
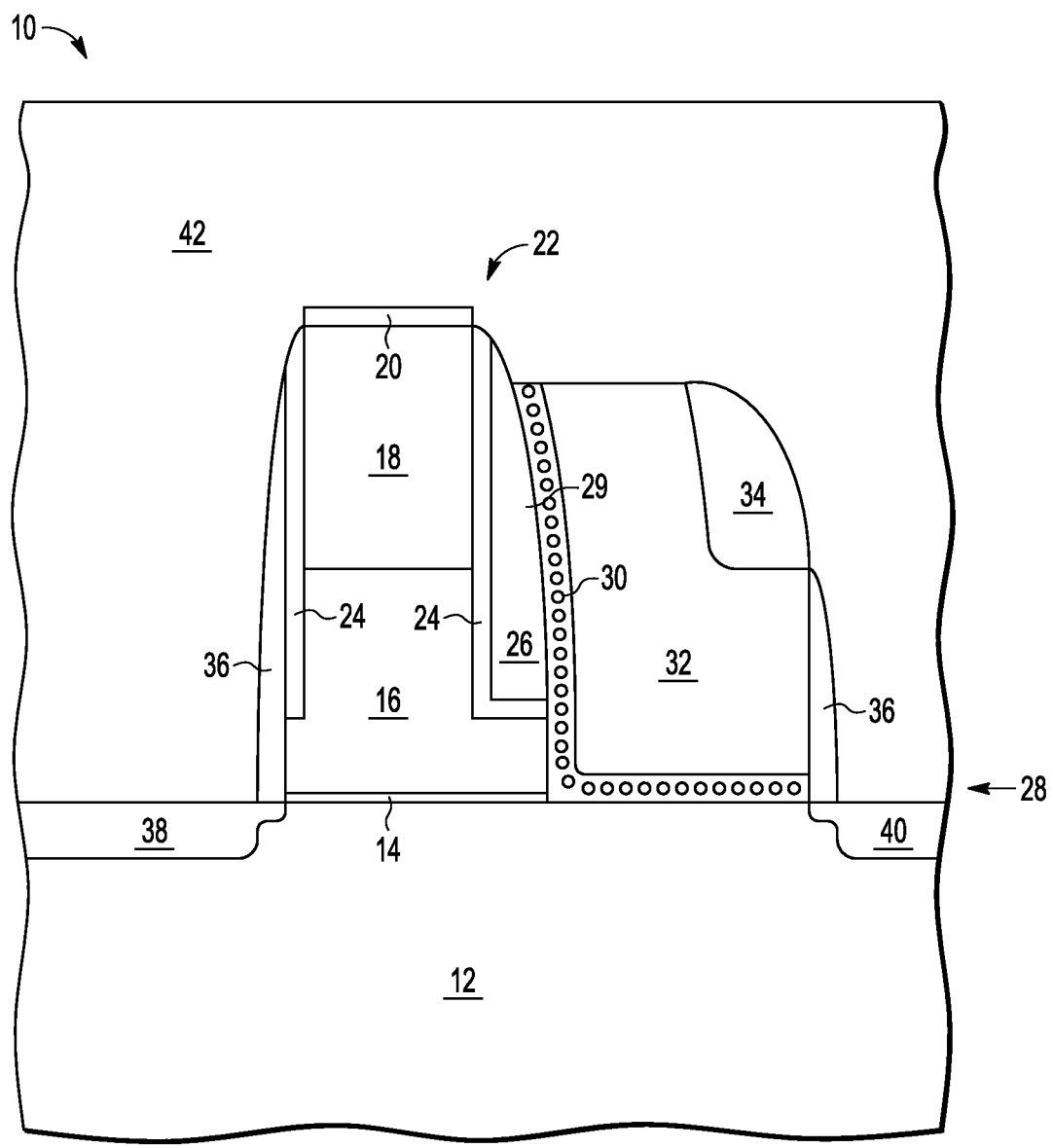
FIG. 14 is a cross section of the split-gate NVM cell of FIG. 13 at a subsequent stage in processing.

Shown in FIG. 14 is semiconductor device 10 after forming an interlayer dielectric 42 over select gate stack 22, conductive layer 32, and source/drains 38 and 40.

Figure 15:
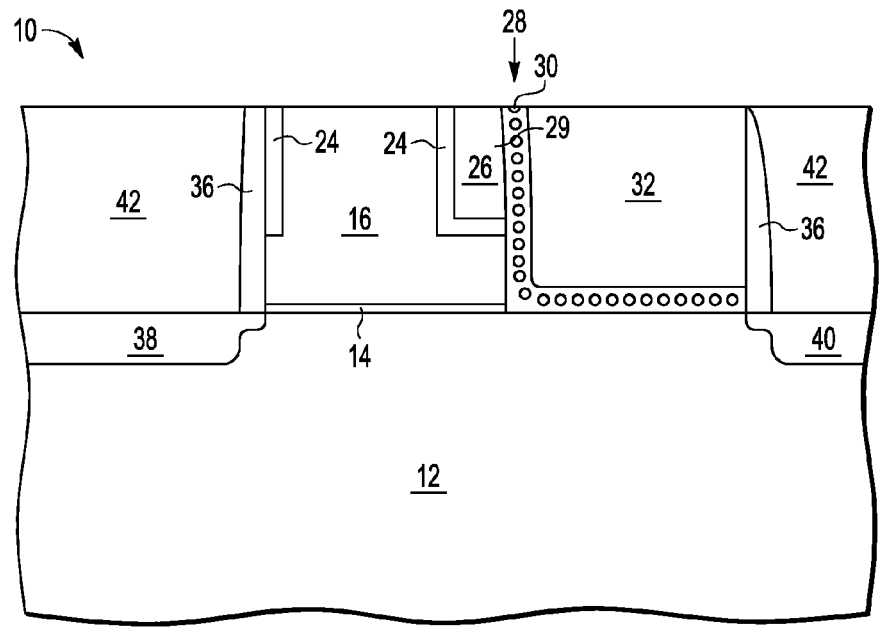
FIG. 15 is a cross section of the split-gate NVM cell of FIG. 14 at a subsequent stage in processing.

Shown in FIG. 15 is semiconductor device 10 after performing a planarizing step that may be achieved by chemical mechanical polishing (CMP) just below the top of conductive layer 16 which has the effect of exposing a portion of nanocrystal 30. The CMP can also have the effect of leaving trace contaminants on and perhaps driven into the planarized surface which would include the surface between conductive layer 32 and conductive layer 16. The result is that the top surface of the select gate, which is the remaining portion of conductive layer 16, and the top surface of the control gate, which is the remaining portion of conductive layer 32, are substantially coplanar. The remaining portion of sidewall spacer 29 functions as an isolation region.

Figure 16:
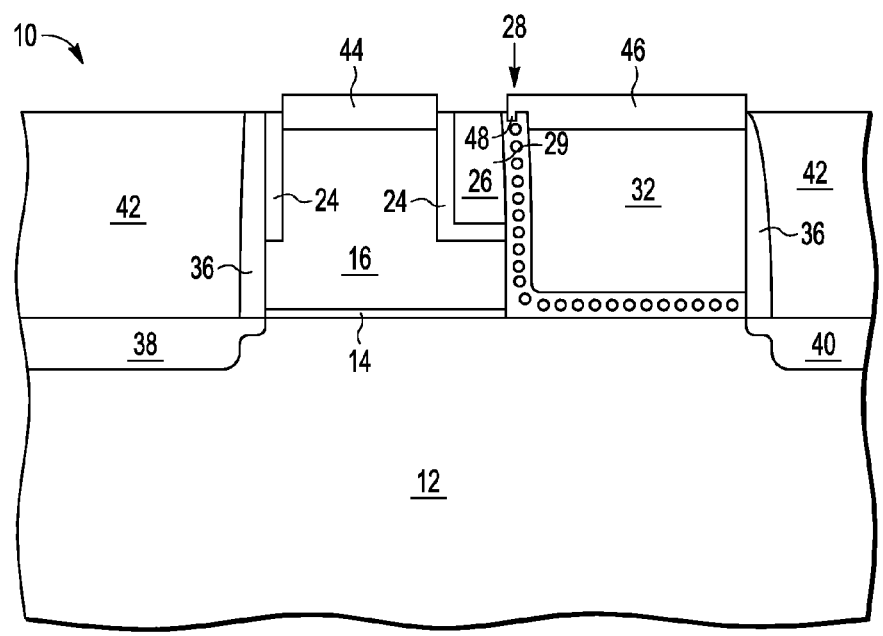
FIG. 16 is a cross section of the split-gate NVM cell of FIG. 15 at a subsequent stage in processing.

Shown in FIG. 16 is semiconductor device 10 after performing silicidation which results in silicide region 44 on conductive layer 16 and silicide region 46 on conductive layer 32. The silicidation also occurs with nanocrystal 30 resulting in a silicide region 48, where nanocrystal 30 was present, that bridges to silicide region 46. The top dielectric of charge storage layer 28 is insufficient to consistently prevent this silicide bridging between exposed nanocrystal and conductive layer 32. Sidewall spacer 29 and dielectric layer 24 between the upper portion of conductive layer 16 and conductive layer 32 ensure that the siliciding does not short conductive layer 16 and conductive layer 32. Semiconductor device 10, as shown in FIG. 16, is a split gate NVM cell in which conductive layer 16 and conductive layer 32 are the select gate and control gate, respectively. It should be noted that it is common for the select gate, in a split gate NVM cell, to have a greater length than the minimum available from the semiconductor processing capability so that the optimum length is not compromised in order to have the upper dimension of the select gate be less than the lower portion. Even if the upper dimension is the minimum dimension available, the lower dimension can still be optimized and be larger than the upper dimension.

Figure 17:
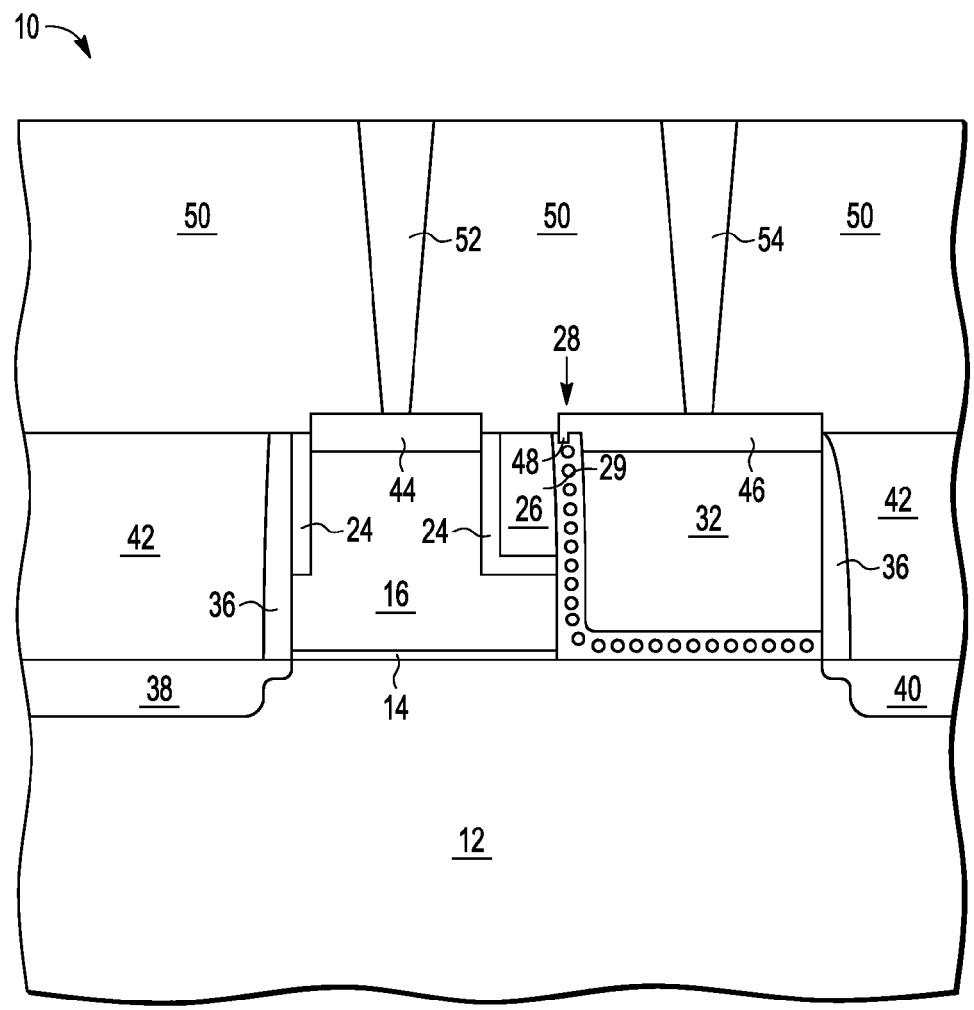
FIG. 17 is a cross section of the split-gate NVM cell of FIG. 16 at a subsequent stage in processing.

Shown in FIG. 17 is semiconductor 10 after depositing a layer 50 that may be of oxide, which may be multiple layers and may include thin layers that are not oxide, which is useful as an interlayer dielectric (ILD) with contacts 52 and 54 contacting silicide 44 and 46, respectively.

Figure 18:
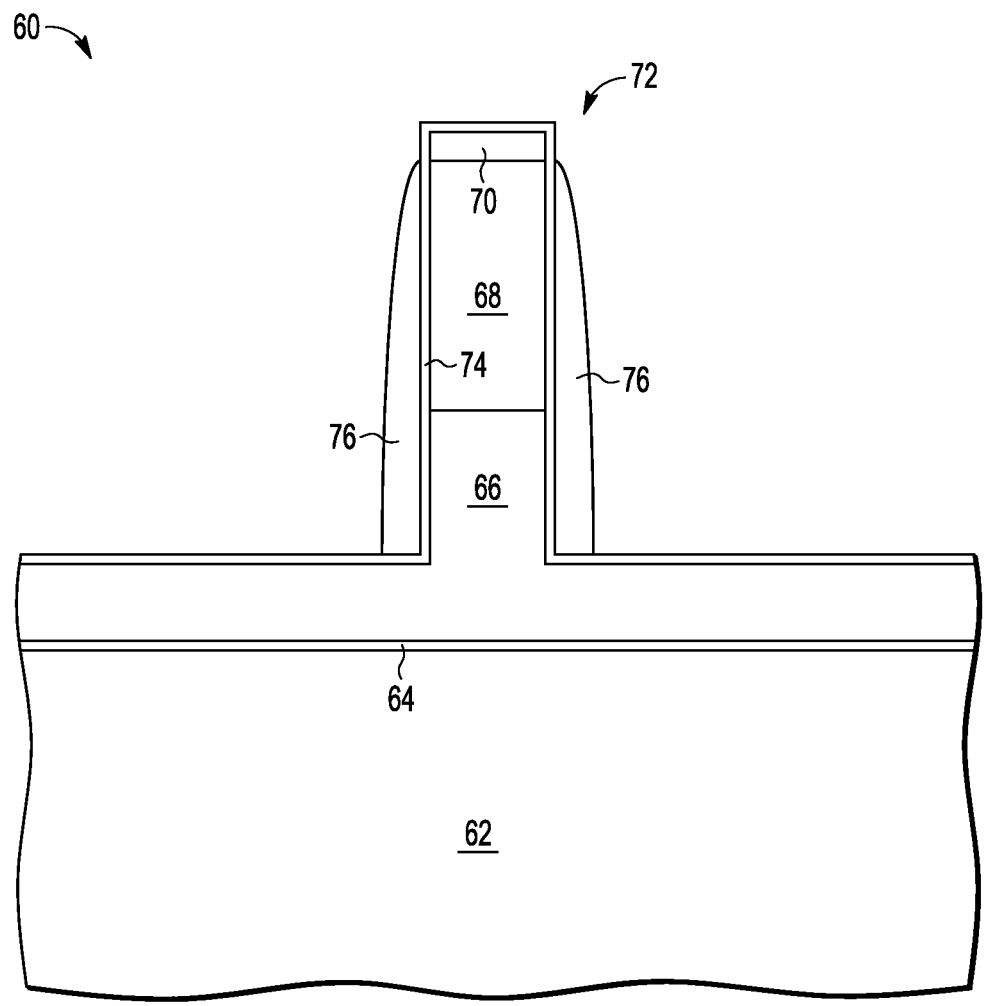
FIG. 18 is a cross section of a split-gate NVM cell at a stage in processing according to a second process.

Shown in FIG. 18 is a semiconductor device 60 having a substrate 62, a dielectric 64 that may be thermal oxide, a conductive layer 66 that may be polysilicon having an upper portion and a lower portion, a dielectric layer 68 that may be nitride aligned with the upper portion of conductive layer 66, a dielectric layer 70 that may be oxide on top of dielectric layer 68, a dielectric layer 74 that is a liner over dielectric layer 70, on the sidewalls of dielectric layer 68 and the upper portion of conductive layer 66, and over the top of the lower portion of conductive layer 66 which forms a select gate stack. Semiconductor device 60 also has a sidewall spacer 76 around the upper portion of conductive layer 66 and around dielectric layer 68. Semiconductor device 60 may be formed in the same way as semiconductor device 10 of FIG. 4 and in the same manner as shown and described for FIGS. 1-4.

Figure 19:
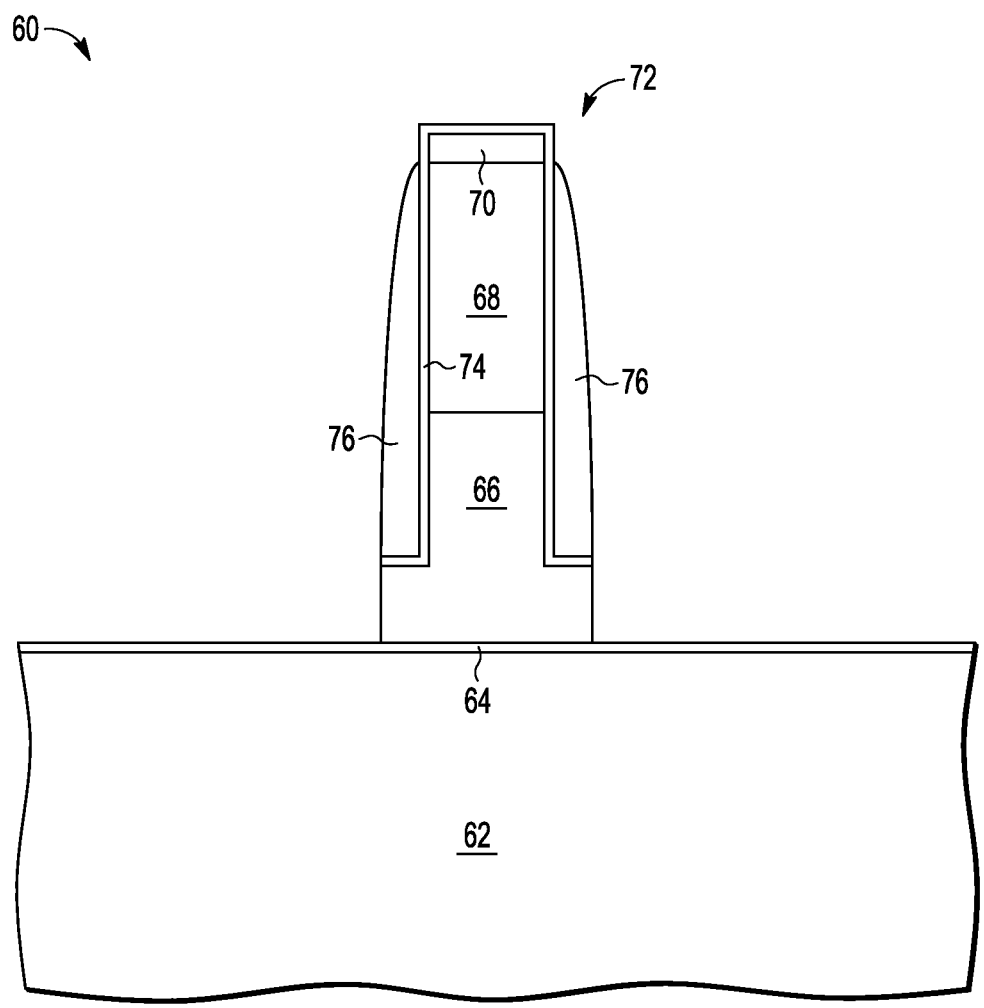
FIG. 19 is a cross section of the split-gate NVM cell of FIG. 18 at a subsequent stage in processing.

Shown in FIG. 19 is semiconductor device 60 after performing an etch of the lower portion of conductive layer 66 aligned to sidewall spacer 76 that removes conductive layer 66 that extends outside that covered by sidewall spacer 76. Thus the lower portion of conductive layer 66 is wider than the upper portion by amount of two times the thickness of dielectric layer 74 and sidewall spacer 76 at the bottom of sidewall spacer 76.

Figure 20:
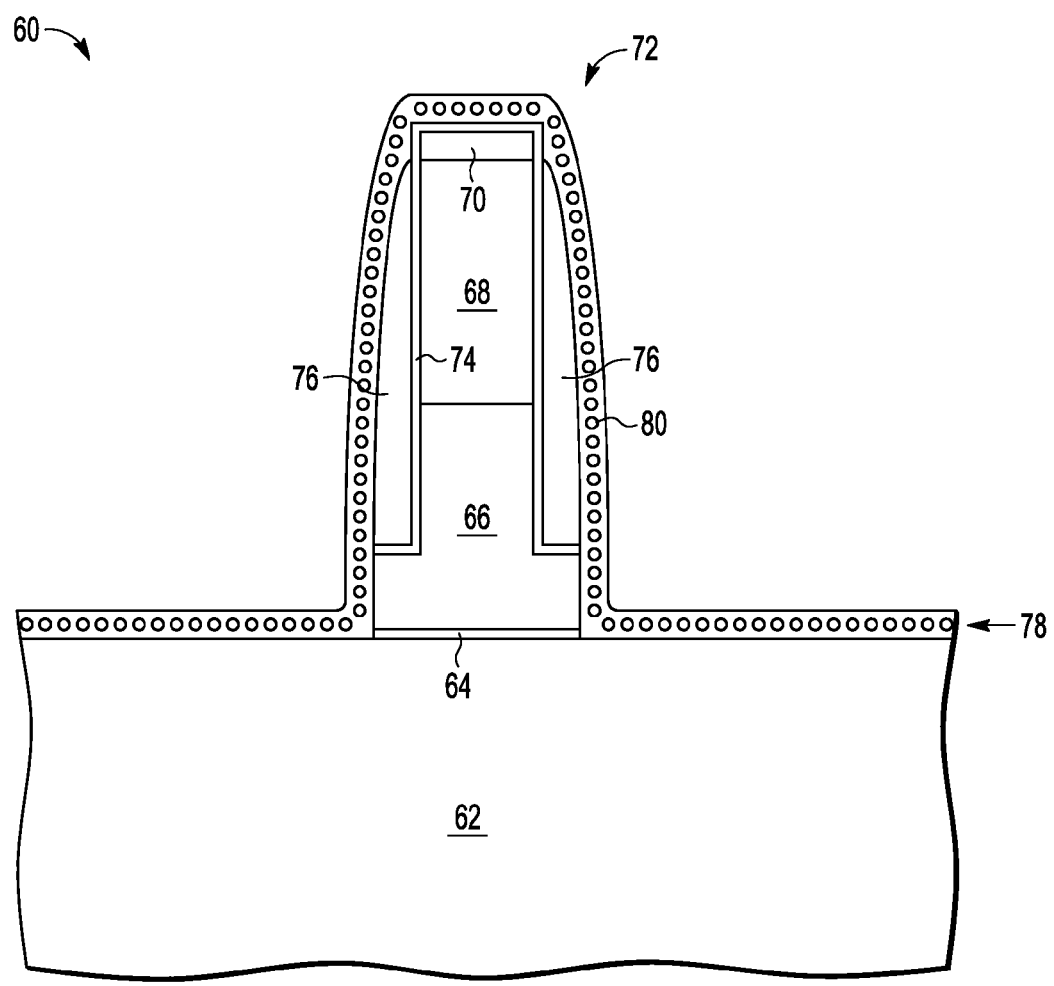
FIG. 20 is a cross section of the split-gate NVM cell of FIG. 19 at a subsequent stage in processing.

Shown in FIG. 20 is semiconductor device 60 after forming a charge storage layer 78 that may have nanocrystals over select gate stack of FIG. 19. A nanocrystal 80 is one nanocrystal that is in a position to be exposed when a subsequent planarizing step is performed to planarize just below the top of the upper portion of conductive layer 66.

Figure 21:
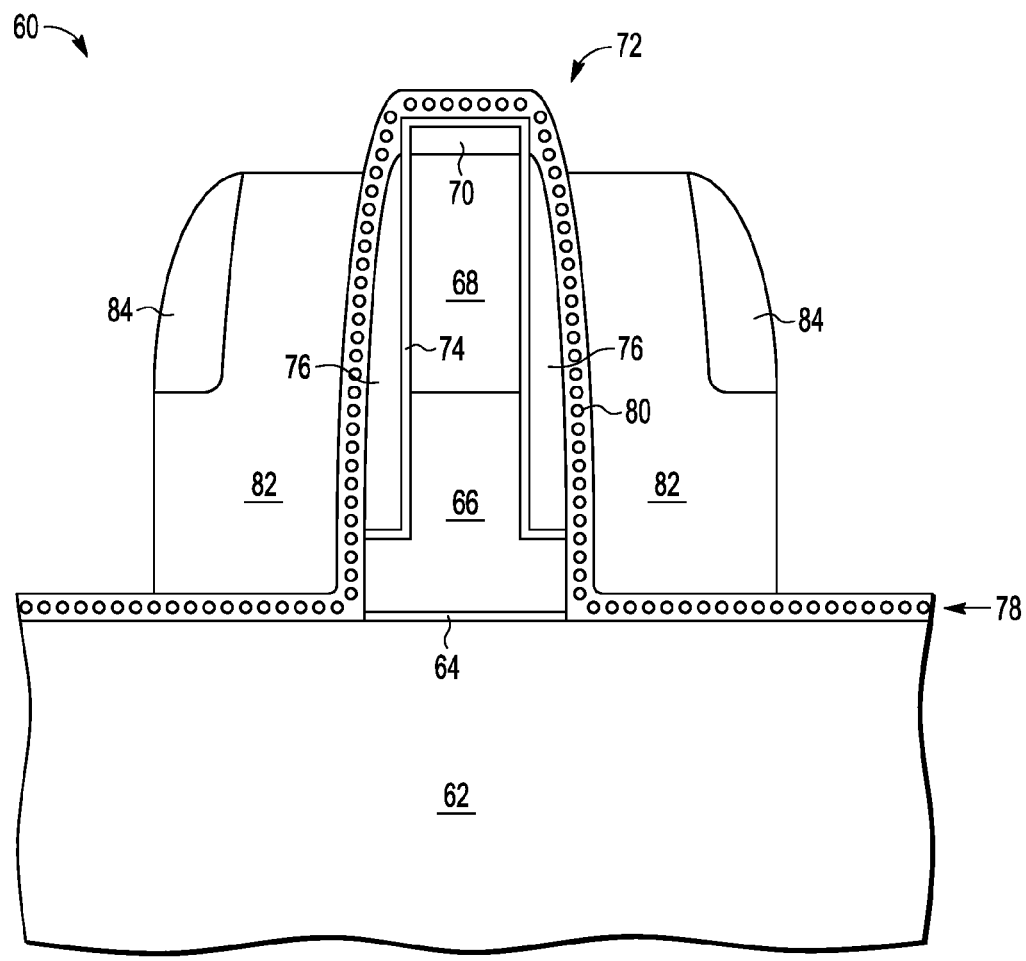
FIG. 21 is a cross section of the split-gate NVM cell of FIG. 20 at a subsequent stage in processing.

Shown in FIG. 21 is semiconductor device 60 after depositing and etching a conductive layer 82 and a dielectric layer in a similar manner to that shown and described for FIGS. 8-10 resulting in portions of conductive layer 82 on sides of select gate stack 72 and sidewall spacer 84 useful as etch masks.

Figure 22:
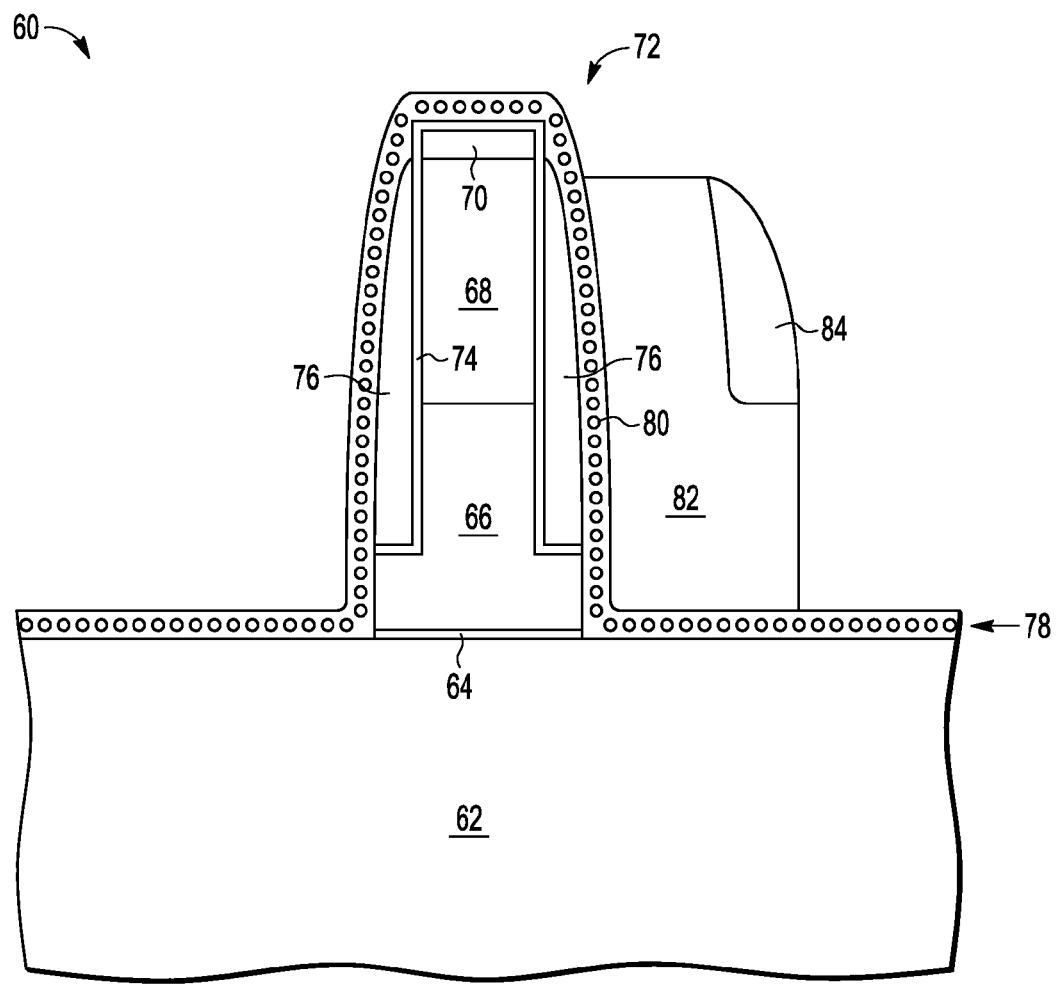
FIG. 22 is a cross section of the split-gate NVM cell of FIG. 21 at a subsequent stage in processing.

Shown in FIG. 22 is semiconductor device 60 after removing conductive layer 82 and dielectric layer 84 on one side of select gate stack similar to that shown in FIG. 11.

Figure 23:
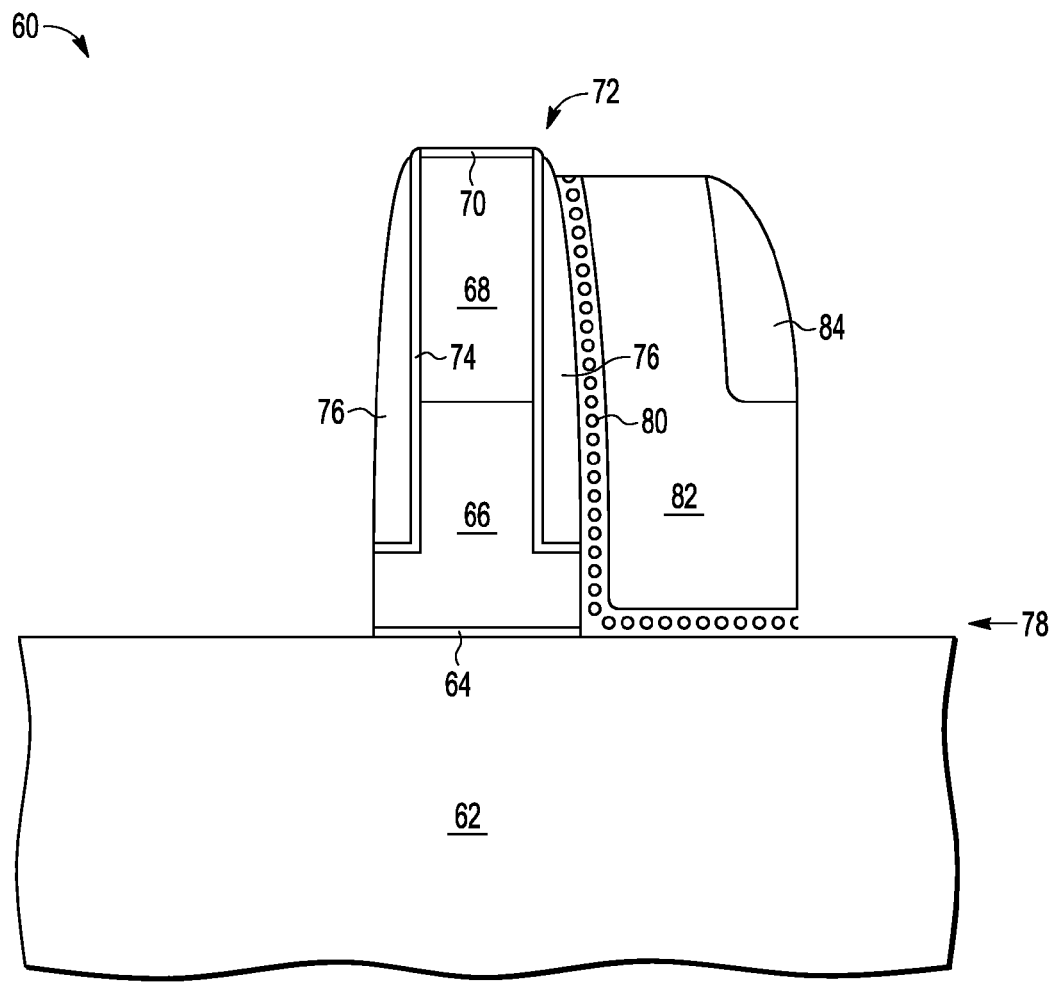
FIG. 23 is a cross section of the split-gate NVM cell of FIG. 22 at a subsequent stage in processing.

Shown in FIG. 23 is semiconductor device 60 after removing a portion of charge storage layer 78 with a result similar to that shown in FIG. 12.

Figure 24:
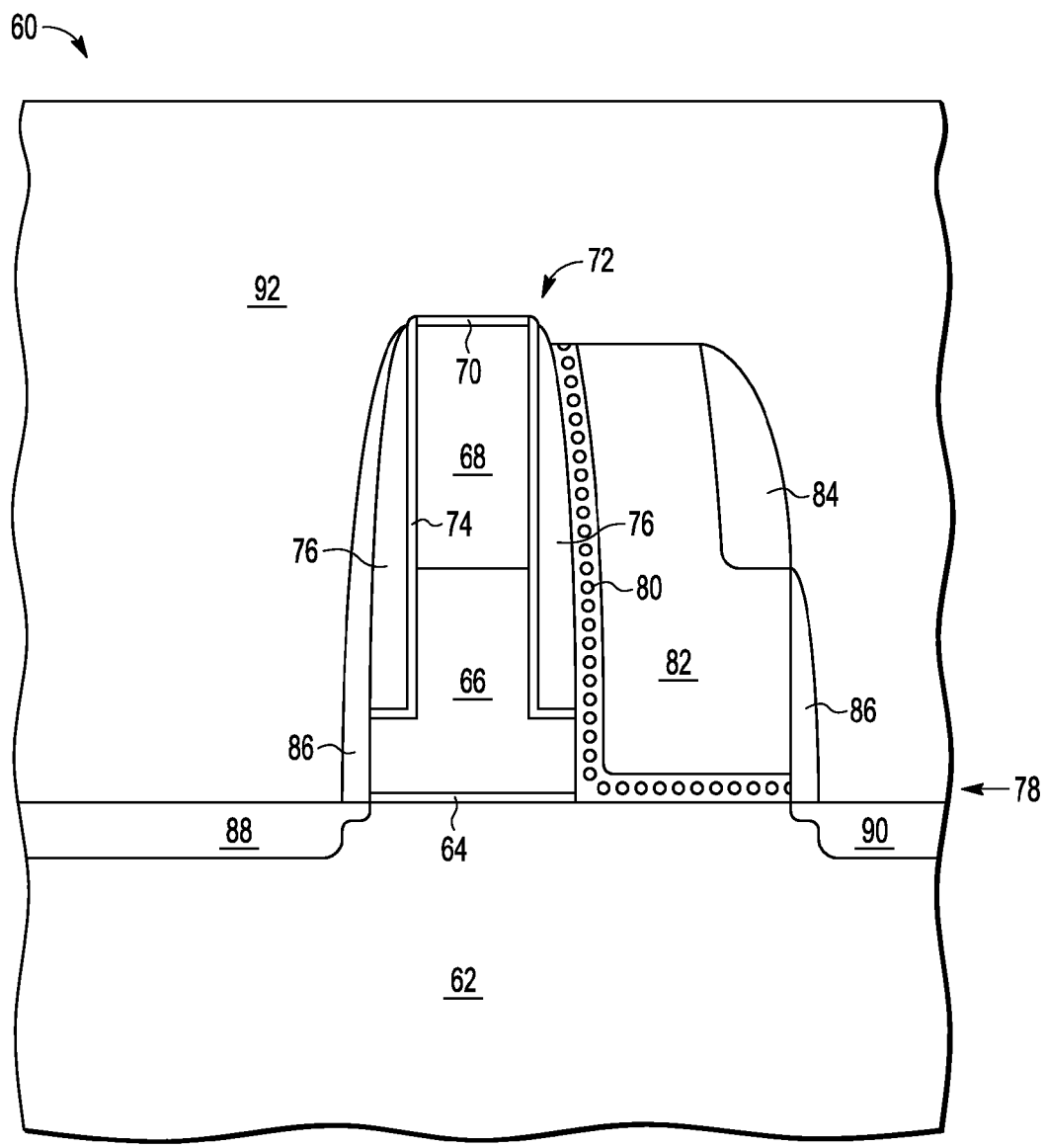
FIG. 24 is a cross section of the split-gate NVM cell of FIG. 23 at a subsequent stage in processing.

Shown in FIG. 24 is semiconductor device 60 after forming sidewall spacer 86 and source/drain regions similar to that shown in FIG. 13 and forming an interlayer dielectric layer 92 over select gate stack 72, conductive layer 82, and source/drain regions 88 and 90 similar to that shown in FIG. 14.

Figure 25:
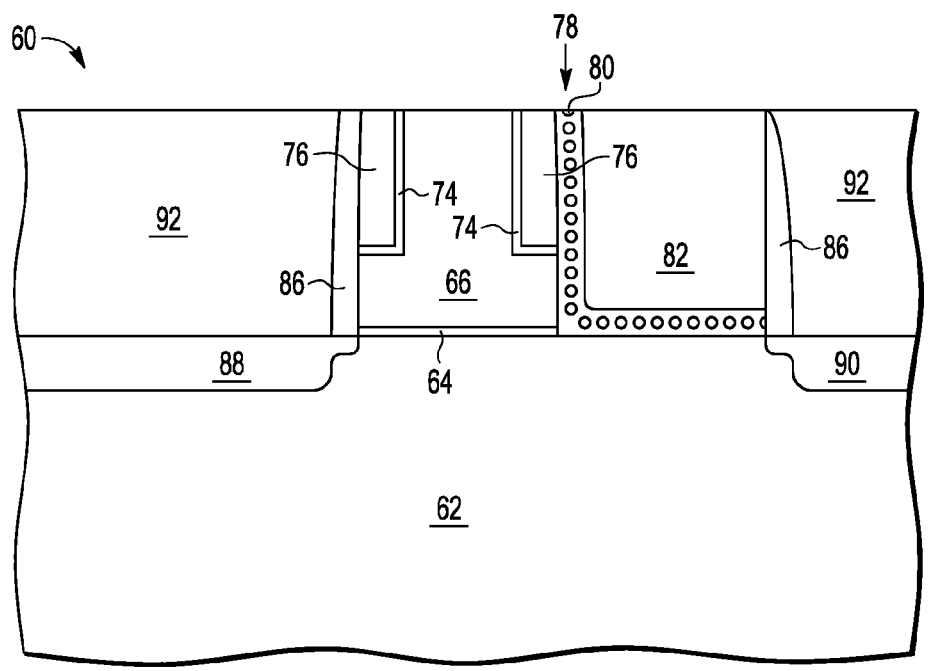
FIG. 25 is a cross section of the split-gate NVM cell of FIG. 24 at a subsequent stage in processing.

Shown in FIG. 25 is semiconductor device 60 after planarizing just below the top surface of conductive layer 66 that results in planarizing through nanocrystal 80 and thereby exposing a significant portion of nanocrystal 80 similar to that shown and described for FIG. 15.

Figure 26:
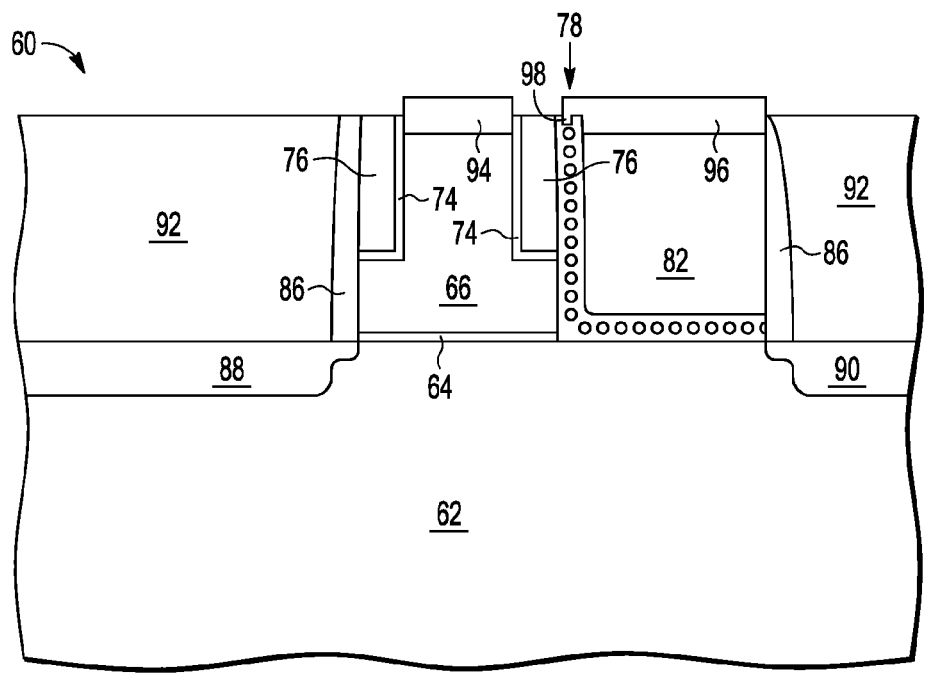
FIG. 26 is a cross section of the split-gate NVM cell of FIG. 25 at a subsequent stage in processing.

Shown in FIG. 26 is semiconductor device 60 after performing silicidation to result in silicide region 94 on the top portion of conductive layer 66 and silicide region 96 on the top portion of conductive layer 82 that extends to a region 98 where nanocrystal 80 had been but is now completely silicided and is shorted to conductive layer 82 by silicide region 96. Sidewall spacer 76 and dielectric layer 74 prevent a similar silicide extension to conductive layer 66. Sidewall spacer 76 and dielectric layer 74 also prevent contamination that may be present on the top of contamination occurring during CMP from causing poor isolation between conductive layer 66 and conductive layer 82. This is similar to that described in shown for FIG. 16 and shows semiconductor device 60 as a split gate NVM cell with remaining conductive layer 66 as a select gate and remaining conductive layer 82 as a control gate.

Figure 27:
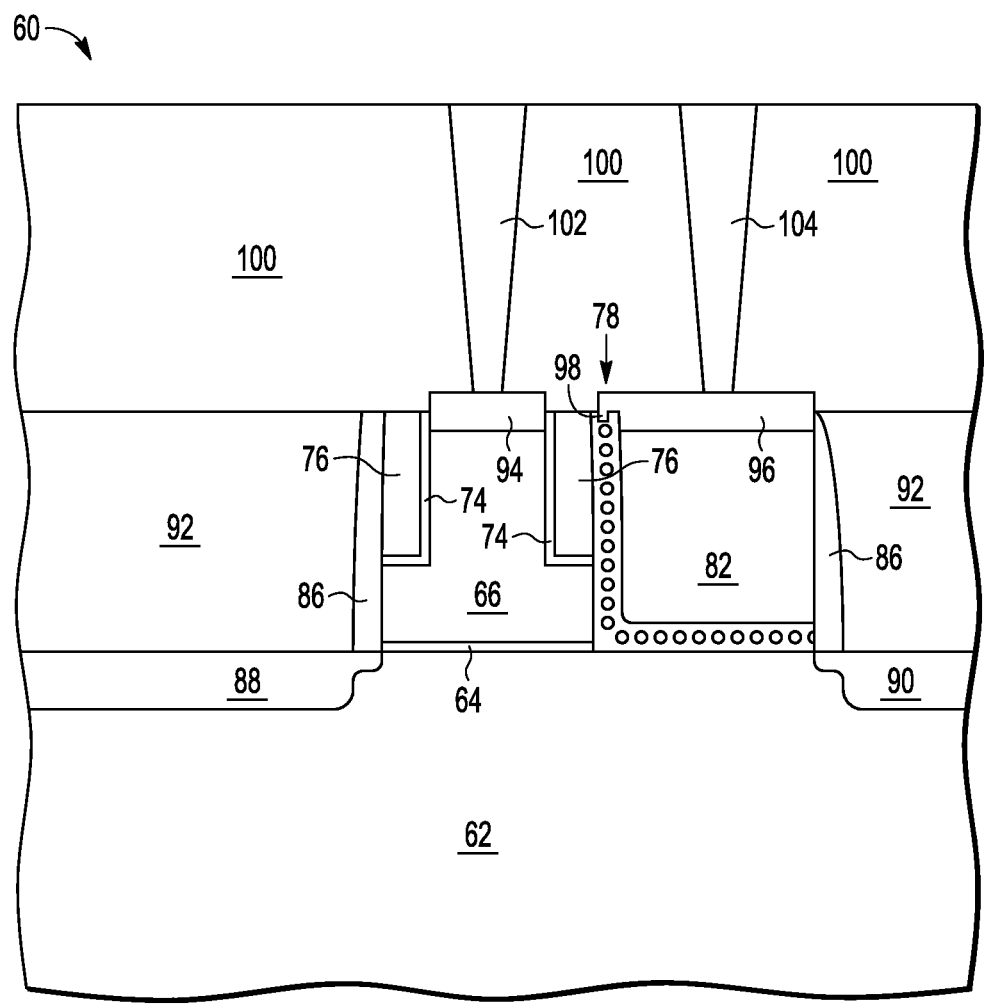
FIG. 27 is a cross section of the split-gate NVM cell of FIG. 26 at a subsequent stage in processing.

Shown in FIG. 27 is semiconductor device 10 after forming and ILD 100 with contacts 102 and 104 contacting silicide regions 94 and 96, respectively.

By now it should be appreciated that there has been provided a split gate memory device including a semiconductor substrate. The split gate memory device further includes a select gate over the semiconductor substrate, the select gate having a bottom portion and a top portion over the bottom portion, wherein the top portion has a top sidewall and the bottom portion has a bottom sidewall, and wherein the bottom sidewall extends beyond the top sidewall. The split gate memory device further includes a control gate adjacent the select gate. The split gate memory device further includes a charge storage layer located between the select gate and the control gate and between the control gate and the semiconductor substrate, wherein the bottom sidewall extends to the charge storage layer. The split gate memory device further includes a first isolation region over the bottom portion of the select gate and between the top sidewall of the select gate and the charge storage layer. The split gate memory device may have a further characterization by which a top surface of the control gate and a top surface of the select gate are substantially coplanar. The split gate memory device may further include a first silicide layer at the top surface of the control gate and a second silicide layer at the top surface of the select gate. The split gate memory device may have a further characterization by which the charge storage layer comprises nanocrystals, and wherein the second silicide layer extends to a nanocrystal of the charge storage layer between the control gate and the select gate. The split gate memory device may have a further characterization by which the first isolation region comprises nitride. The split gate memory device may have a further characterization by which wherein the top portion comprises a second top sidewall opposite the top sidewall, and the bottom portion comprises a second bottom sidewall opposite the bottom sidewall, wherein the second bottom sidewall extends beyond the second top sidewall and the split gate memory device may further include a second isolation region over the bottom portion of the select gate and adjacent the second top sidewall, wherein the top portion of the select gate is between the first isolation region and the second isolation region.

Also disclosed is a method for forming a split gate memory device. The method includes forming a select gate over a semiconductor structure having a top portion and a bottom portion, wherein the bottom portion is between the top portion and the semiconductor substrate, and the top portion has a smaller width than the bottom portion. The method further includes forming a first insulating layer over the bottom portion of the select gate and adjacent a first sidewall of the top portion of the select gate. The method further includes removing portions of the bottom portion of the select gate exposed by the first insulating layer such that a first sidewall of the bottom portion is vertically aligned with a sidewall of the first insulating layer. The method further includes forming a charge storage layer over the semiconductor substrate and the select gate, and along the sidewall of the first insulating layer and the first sidewall of the bottom portion. The method further includes forming a control gate over the charge storage layer and adjacent the select gate. The method has a further characterization by which the charge storage layer is between the first sidewall of the bottom portion and the control gate, the first isolation region is between the first sidewall of the top portion and the charge storage layer, the charge storage layer is between the first isolation region and the control gate. The method may have a further characterization by which the forming the first insulating layer includes depositing a layer of insulating material over the semiconductor substrate and the select gate and anisotropically etching the layer of insulating material to form the first insulating layer. The method may have a further characterization by which the forming the first insulating layer further includes depositing a liner layer over the semiconductor substrate and the select gate wherein the layer of insulating material is deposited over the liner layer and wherein the anisotropically etching comprises etching the liner layer. The method may have a further characterization by which the forming the charge storage layer includes forming a bottom dielectric layer over the semiconductor substrate and the select gate, and along the sidewall of the first insulating layer and the first sidewall of the bottom portion, forming a layer of nanocrystals over the bottom dielectric layer, and forming a top dielectric layer over the layer of nanocrystals. The method may further include forming a second insulating layer over the bottom portion of the select gate and adjacent a second sidewall of the top portion of the select gate, wherein the second sidewall of the top portion is opposite the first sidewall of the top portion. The method may have a further characterization by which the forming the first and second insulating layers, depositing a layer of insulating material over the semiconductor substrate and the select gate, and anisotropically etching the layer of insulating material to form the first and second insulating layers. The method may have a further characterization by which, prior to the forming the charge storage layer, the method includes removing the second insulating layer. The method may have a further characterization by which the removing portions of the bottom portion of the select gate exposed by the first insulating layer comprises removing portions of the bottom portion of the select gate which extend beyond the second sidewall of the top portion such that the second sidewall of the bottom portion is substantially vertically aligned with the second sidewall of the top portion. The method may further include polishing the select gate and the control gate such that a top surface of the select gate is substantially coplanar with a top surface of the control gate, and wherein a portion of the charge storage layer is exposed between the top portion of the select gate and the control gate. The method may have a further characterization by which, after polishing, the method may further include forming a first silicide layer at the top surface of the select gate and forming a second silicide layer at the top surface of the control gate. The method may further include forming an interlayer dielectric layer around the select gate and the control gate.

Disclosed also is a method for forming a split gate memory device. The method further includes forming a first conductive layer over a semiconductor substrate. The method further includes etching the first conductive layer to form a top portion and a bottom portion of the first conductive layer, wherein the bottom portion is between the top portion and the semiconductor substrate, and the top portion has a smaller width than the bottom portion. The method further includes forming an insulating layer over the first conductive layer. The method further includes etching the insulating layer to form a first spacer over the bottom portion of the first conductive layer and adjacent a first sidewall of the top portion of the first conductive layer and a second spacer over the bottom portion of the first conductive layer and adjacent a second sidewall of the top portion, opposite the first sidewall of the top portion. The method further includes removing portions of the bottom portion exposed by the first spacer to form a select gate having the top portion and the bottom portion, resulting in a first sidewall of the bottom portion vertically aligned with the first spacer. The method further includes forming a charge storage layer over the semiconductor substrate, the select gate, and along the first spacer and the first sidewall of the bottom portion. The method further includes forming a second conductive layer over the charge storage layer. The method further includes patterning the second conductive layer to form a control gate over the charge storage layer and adjacent the select gate, wherein the charge storage layer is between the first sidewall of the bottom portion and the control gate, the first sidewall spacer is between the first sidewall of the top portion and the charge storage layer, and the charge storage layer is between the first sidewall spacer and the control gate. The method may further include polishing the select gate and the control gate, wherein the polishing exposes a portion of the charge storage layer between the top portion of the select gate and the control gate, and, after the polishing, forming a first silicide layer at a top surface of the select gate and forming a second silicide layer at a top surface of the control gate. The method may further include, prior to the forming the charge storage layer, removing the second spacer, and wherein the removing portions of the bottom portion comprises removing portions of the bottom portion which extend beyond the second sidewall of the top portion.

Although the invention is described herein with reference to specific embodiments, various modifications and changes can be made without departing from the scope of the present invention as set forth in the claims below. For example, other combinations of materials for the various purposes of conductivity and dielectric properties may be effective. Also a particular combination for providing spacing between the select gate and the charge storage layer was described but other ways than those described may be found effective. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for forming a split gate memory device, comprising:
    forming a select gate of the split gate memory device over a semiconductor substrate having a top portion and a bottom portion, wherein the bottom portion is between the top portion and the semiconductor substrate, and the top portion has a smaller width than the bottom portion;
    forming a first insulating layer over the bottom portion of the select gate and adjacent a first sidewall of the top portion of the select gate;
    removing portions of the bottom portion of the select gate exposed by the first insulating layer such that a first sidewall of the bottom portion is vertically aligned with a sidewall of the first insulating layer;
    forming a charge storage layer of the split gate memory device over the semiconductor substrate and the select gate, and along the sidewall of the first insulating layer and the first sidewall of the bottom portion; and
    after forming the charge storage layer, forming a control gate of the split gate memory device over the charge storage layer and adjacent the select gate, wherein:
        the charge storage layer is between the first sidewall of the bottom portion and the control gate,
        a first isolation region formed from the first insulating layer is between the first sidewall of the top portion and the charge storage layer and not between the first sidewall of the bottom portion and the charge storage layer, the charge storage layer is between the first isolation region and the control gate, and after formation of the charge storage layer and the control gate, the top portion remains smaller in width than the bottom portion.

2. The method of claim 1, wherein the forming the first insulating layer comprises:

depositing a layer of insulating material over the semiconductor substrate and the select gate; and anisotropically etching the layer of insulating material to form the first insulating layer.

3. The method of claim 2, wherein the forming the first insulating layer further comprises:

depositing a liner layer over the semiconductor substrate and the select gate wherein the layer of insulating material is deposited over the liner layer and wherein the anisotropically etching comprises etching the liner layer.

4. The method of claim 1, wherein the forming the charge storage layer comprises:

forming a bottom dielectric layer over the semiconductor substrate and the select gate, and along the sidewall of the first insulating layer and the first sidewall of the bottom portion;

forming a layer of nanocrystals over the bottom dielectric layer; and forming a top dielectric layer over the layer of nanocrystals.

5. The method of claim 1, further comprising:

forming a second insulating layer over the bottom portion of the select gate and adjacent a second sidewall of the top portion of the select gate, wherein the second sidewall of the top portion is opposite the first sidewall of the top portion.

6. The method of claim 5, wherein the forming the first and second insulating layers comprises:

depositing a layer of insulating material over the semiconductor substrate and the select gate; and anisotropically etching the layer of insulating material to form the first and second insulating layers.

7. The method of claim 6, wherein prior to the forming the charge storage layer, the method comprises:

removing the second insulating layer.

8. The method of claim 7, wherein the removing portions of the bottom portion of the select gate exposed by the first insulating layer comprises removing portions of the bottom portion of the select gate which extend beyond the second sidewall of the top portion such that the second sidewall of the bottom portion is substantially vertically aligned with the second sidewall of the top portion.

9. The method of claim 1, further comprising:

polishing the select gate and the control gate such that a top surface of the select gate is substantially coplanar with a top surface of the control gate, and wherein a portion of the charge storage layer is exposed between the top portion of the select gate and the control gate.

10. The method of claim 9, wherein after the polishing, the method further comprises:

forming a first silicide layer at the top surface of the select gate; and forming a second silicide layer at the top surface of the control gate.

11. The method of claim 10, further comprising:

forming an interlayer dielectric layer around the select gate and the control gate.

12. A method for forming a split gate memory device, comprising:

forming a first conductive layer of the split gate memory device over a semiconductor substrate;

etching the first conductive layer to form a top portion and a bottom portion of the first conductive layer, wherein the bottom portion is between the top portion and the semiconductor substrate, and the top portion has a smaller width than the bottom portion;

forming an insulating layer over the first conductive layer;

etching the insulating layer to form a first spacer over the bottom portion of the first conductive layer and adjacent a first sidewall of the top portion of the first conductive layer and a second spacer over the bottom portion of the first conductive layer and adjacent a second sidewall of the top portion, opposite the first sidewall of the top portion;

removing portions of the bottom portion exposed by the first spacer to form a select gate having the top portion and the bottom portion, resulting in a first sidewall of the bottom portion vertically aligned with the first spacer;

forming a charge storage layer of the split gate memory device over the semiconductor substrate, the select gate, and along the first spacer and the first sidewall of the bottom portion;

after forming the charge storage layer, forming a second conductive layer over the charge storage layer; and after forming the second conductive layer, patterning the second conductive layer to form a control gate of the split gate memory device over the charge storage layer and adjacent the select gate, wherein:

the charge storage layer is between the first sidewall of the bottom portion and the control gate, the first spacer is between the first sidewall of the top portion and the charge storage layer and not between the first sidewall of the bottom portion and the charge storage layer, the charge storage layer is between the first spacer and the control gate, and after formation of the charge storage layer and the control gate, the top portion remains smaller in width than the bottom portion.

13. The method of claim 12, further comprising:

polishing the select gate and the control gate, wherein the polishing exposes a portion of the charge storage layer between the top portion of the select gate and the control gate;

after the polishing, forming a first silicide layer at a top surface of the select gate and forming a second silicide layer at a top surface of the control gate.

14. The method of claim 12, further comprising, prior to the forming the charge storage layer, removing the second spacer, and wherein the removing portions of the bottom portion comprises removing portions of the bottom portion which extend beyond the second sidewall of the top portion.

* * * * *